US008361268B2

(12) United States Patent
Mizuno et al.

(10) Patent No.: US 8,361,268 B2
(45) Date of Patent: Jan. 29, 2013

(54) METHOD OF TRANSFERRING DEVICE

(75) Inventors: Takeshi Mizuno, Tokyo (JP); Katsuhiro Tomoda, Kanagawa (JP); Toyoharu Oohata, Tokyo (JP)

(73) Assignee: Sony Corporation, Tokyo (JP)

(*) Notice: Subject to any disclaimer, the term of this patent is extended or adjusted under 35 U.S.C. 154(b) by 364 days.

(21) Appl. No.: 12/731,799

(22) Filed: Mar. 25, 2010

(65) Prior Publication Data

US 2010/0258543 A1   Oct. 14, 2010

(51) Int. Cl.
*H01L 21/82* (2006.01)
(52) U.S. Cl. ............... 156/249; 156/272.8; 438/128
(58) Field of Classification Search ............ 219/121.69, 219/121.85, 121.6, 121.65, 121.66; 156/241, 156/244.17, 249, 379.6, 272.2, 272.8; 438/128, 438/464, 982
See application file for complete search history.

(56) References Cited

U.S. PATENT DOCUMENTS 6,683,416 B1 * 1/2004 Oohata et al. .............. 315/169.3
8,056,222 B2 * 11/2011 Pique et al. .................... 29/832

FOREIGN PATENT DOCUMENTS

JP   2002-314053   10/2002

* cited by examiner

*Primary Examiner* — Samuel M Heinrich
(74) *Attorney, Agent, or Firm* — SNR Denton US LLP

(57) ABSTRACT

A method of transferring a device includes the steps of: arranging a first substrate, on which a device is provided with a release layer having a planar shape equal to or smaller than the device interposed therebetween, and a second substrate, on which an adhesive layer is provided, so as to be spaced from and opposite each other in a state where the device and the adhesive layer face each other; and irradiating a laser beam having an irradiation area larger than the base area of the release layer onto the entire surface of the release layer from the first substrate side so as to ablate the release layer, to separate the device from the first substrate, and to transfer the device on the second substrate.

7 Claims, 11 Drawing Sheets

A-A'

(1)

(2)

(1)

(2)

(1)

(2)

(1)

(2)

(1)

(2)

(3)

(4)

METHOD OF TRANSFERRING DEVICE

BACKGROUND OF THE INVENTION

1. Field of the Invention

The present invention relates to a method of transferring a device, and in particular, to a method of transferring a device from a first substrate onto a second substrate by a laser ablation technique.

2. Description of the Related Art

As a method of selectively and accurately transferring part of a group of devices arranged on a first substrate onto a second substrate, there is an attempt for application of a laser ablation technique. Device transfer using a laser ablation technique is carried out as follows. First, the first substrate and the second substrate are arranged such that the device arrangement surface of the first substrate and the adhesive layer forming surface of the second substrate face each other. In this state, a laser beam is irradiated only onto a position corresponding to a device to be transferred from the first substrate side. Thus, a release layer provided between the first substrate and the device is instantaneously evaporated (ablated) and gasified, and the device is released from the first substrate, and adhered and fixed to an adhesive layer on the second substrate.

A method is also suggested in which, when the laser beam is irradiated, a first substrate and a second substrate are arranged to be spaced from and opposite each other. Thus, there are no problems due to uneven pressure imposed on the two substrates and no problems regarding alignment. In addition, there is no case where an adhesive is stuck to an excess portion or the two substrates are not completely separated from each other after transfer. Furthermore, according to this technique, the surface of the device onto which the laser beam is irradiated is processed in advance, such that the application direction of pressure of gas caused by laser irradiation is regulated and the device scattering direction is controlled (see JP-A-2002-314053 (paragraphs 0010 and 0020)).

SUMMARY OF THE INVENTION

With the above-described method, however, it takes a lot of trouble to process the surface of the device onto which the laser beam is irradiated in advance so as to accurately transfer a device onto the second substrate arranged apart. In addition, when the surface of the device should be maintained flat, it is difficult to control the device scattering direction.

Thus, it is desirable to provide a method of transferring a device capable of accurately transferring a device onto a second substrate arranged apart without processing the surface of the device.

A method of transferring a device according to an embodiment of the invention is carried out as follows. First, a first substrate, on which a device is provided with a release layer interposed therebetween, and a second substrate, on which an adhesive layer is provided, are arranged to be spaced from and opposite each other in a state where the device and the adhesive layer face each other. In this case, the release layer has a planar shape equal to or smaller than the device. In this state, a laser beam having an irradiation area larger than the base area of the release layer is irradiated onto the entire surface of the release layer from the first substrate side. Thus, the release layer is ablated, and the device is separated from the first substrate and transferred onto the second substrate.

With this method, a device scattering direction by ablation of the release layer is controlled vertically with respect to the surfaces of the first substrate and the second substrate.

As a result, according to the embodiment of the invention, it is possible to accurately transfer a device onto the second substrate without processing the surface of the device.

DESCRIPTION OF THE PREFERRED EMBODIMENTS

Hereinafter, respective embodiments of the invention will be described in the following sequence.

1. First Embodiment (an example where a device is transferred from a first substrate onto a second substrate)
2. Second Embodiment (an example where a device is transferred from a first substrate to a device absent part of a second substrate and repaired)
3. Third Embodiment (a first example where arrangement on a first substrate is changed and devices are rearranged on a second substrate)
4. Fourth Embodiment (a second example where arrangement on a first substrate is changed and devices are rearranged on a second substrate)

1. First Embodiment

FIGS. 1A to 1D are sectional process views illustrating a method of transferring a device to which the invention is applied. A method of transferring a device described herein is, for example, a method of transferring an LED device from a first substrate onto a second substrate in a manufacturing process or the like of a display device in which light-emitting diodes (LEDs) are arranged in a matrix. This method is carried out as follows.

Figure 1A:
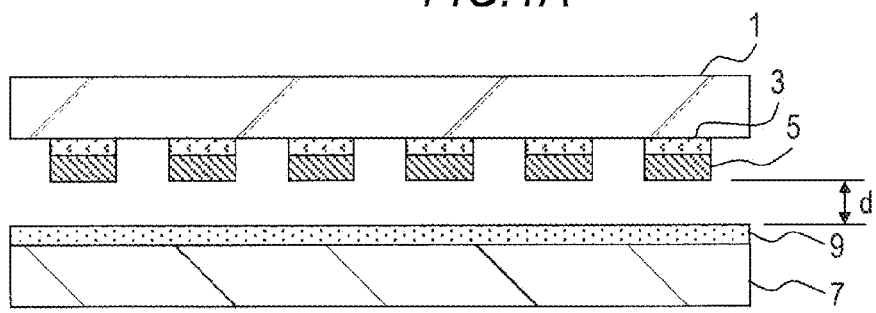
FIGS. 1A to 1D are sectional process views showing a method of transferring a device according to first embodiment.

First, as shown in FIG. 1A, a plurality of devices 5 are placed on a first substrate 1 with a release layer 3 interposed therebetween. An adhesive layer 9 is provided on a second substrate 7.

The first substrate 1 is, for example, a substrate for holding devices constituting a display device. The first substrate 1 is made of a material which is nonabsorbent to a laser beam used in the transfer method as well as such a material that the devices 5 on the first substrate 1 can be observed through the first substrate 1 in a wavelength range outside the wavelength of the laser beam. For the first substrate 1, for example, a quartz substrate is used, but the invention is not limited thereto.

The release layer 3 is made of a material which is explosively evaporated and removed (so-called ablated) by absorbing the laser beam used in the transfer method. For such a material, for example, polyimide is used, but the invention is not limited thereto.

It is important that the release layer 3 is patterned to have a shape equal to or slightly smaller than the base of each of the devices 5 provided on the first substrate 1, that is, a shape enough to fit the range of the base of the device. The release layer 3 preferably has a shape similar to the device. When the device has an axisymmetrical shape, the release layer 3 preferably has a symmetric shape with respect to the axis of the device. The release layer 3 is formed by etching using the devices 5 or an underlying mask pattern conforming to the devices 5. The release layer 3 may be formed by overetching using wet etching.

Examples of the devices 5 include light-emitting devices, such as LED devices, liquid crystal control devices, photoelectric conversion devices, piezoelectric devices, thin-film transistors, thin-film diodes, resistors, switching devices, minute magnetic devices, minute optical devices, and the like.

On the first substrate 1, the devices 5 are arranged in a matrix with a predetermined arrangement state. Devices which are arranged at a predetermined interval on a wafer from among a plurality of devices formed on the wafer are transferred onto the first substrate 1 while maintaining the arrangement state on the wafer. In this way, the devices 5 are provided on the first substrate 1.

The second substrate 7 may be, for example, a mounting substrate constituting a display device or a second substrate for temporarily holding devices. For the second substrate 7, a substrate having necessary characteristics as a mounting substrate or a substrate having necessary characteristics as a substrate for temporary holding is used. When the second substrate 7 is a mounting substrate, arbitrary wiring parts which will be connected to the devices 5 to be transferred may be formed on the second substrate 7.

The adhesive layer 9 may be made of a material having adhesiveness to the devices 5. The adhesive layer 9 may be formed of a layer made of a so-called adhesive, or may be made of a material based on the adhesive.

The first substrate 1 and the second substrate 7 are arranged to be spaced from each other in a state where the devices 5 and the adhesive layer 9 face each other. In this case, the first substrate 1 and the second substrate 7 are arranged to be spaced from and opposite each other in parallel such that a distance d between the devices 5 on the first substrate 1 and the adhesive layer 9 on the second substrate 7 is larger than the thickness of the devices 5.

In this case, the first substrate 1 and the second substrate 7 are supported by independent moving devices, and arranged to be opposite each other as described above by driving of the moving devices. Such moving devices each include a drive system and stages which can move the first substrate 1 and the second substrate 7 in a direction and within a plane perpendicular to the optical axis of a laser beam described below. The moving devices each also include a sensor which measures the distance d between the supported first and second substrates 1 and 7, a drive unit which drives the stages such that the distance d between the first substrate 1 and the second substrate 7 is put in a predetermined state in accordance with the value measured by the sensor, and the like.

Figure 1B:
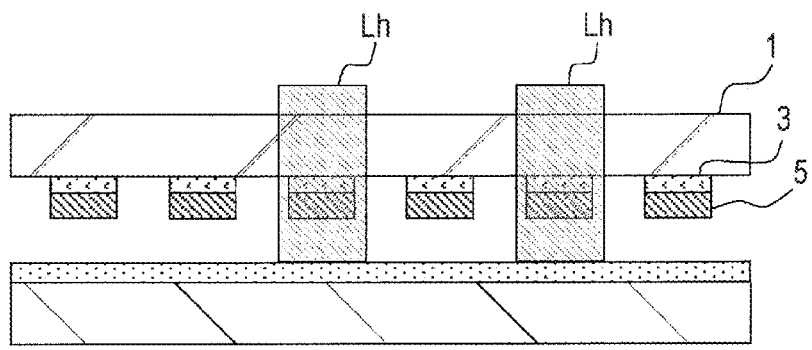

In such a state, as shown in FIG. 1B, a laser beam Lh is irradiated from the first substrate 1 side. The laser beam Lh to be irradiated has a wavelength such that only the release layer 3 absorbs the laser beam Lh from a laser beam source (not shown) to the release layer 3. In this case, the laser beam Lh is selectively irradiated onto a region corresponding to devices 5 selected from a plurality of devices 5 provided on the first substrate 1.

The irradiation position of the laser beam Lh is controlled and the shape of the irradiation surface of the laser beam Lh is adjusted to be equal to or larger than the base shape of the release layer 3, such that the laser beam Lh is irradiated on the entire surface of the release layer 3 between each selected device 5 and the first substrate 1. The laser beam Lh is irradiated such that the section of the irradiated beam is positioned symmetrically with respect to the entire surface of the release layer 3 and thus the in-plane intensity distribution is made uniform at the irradiation position with respect to the release layer 3.

The laser beam Lh is preferably irradiated with irradiation energy such that the release layer 3 between each selected device 5 and the first substrate 1 is completely evaporated and removed by ablation.

With regard to irradiation of the laser beam Lh, the laser beam Lh which is shaped to have a predetermined spot shape (irradiation surface shape) on the laser beam source side is spot-irradiated only onto the release layer 3 in a region corresponding to the selected device 5. In this case, the laser beam Lh may be irradiated only onto the region corresponding to the devices 5 selected from a plurality of devices 5 through a light-blocking mask having openings (not shown). The light-blocking mask is arranged between the laser beam source and the first substrate 1. When such a light-blocking mask is used, the laser beam Lh can be irradiated onto the entire surface of the first substrate 1 in a lump. Thus, a plurality of devices 5 can be transferred simultaneously and selectively by single irradiation of the laser beam Lh.

The laser beam Lh may be sequentially spot-irradiated with respect to a plurality of devices 5. With regard to spot-irradiation of the laser beam Lh with respect to a plurality of devices 5, the irradiation position of the laser beam Lh may be moved with respect to the first substrate 1 and the second substrate 7. In addition, the first substrate 1 and the second substrate 7 may be moved with respect to the irradiation position of the laser beam Lh. In this case, moving devices (drive system or stage) may be used which can move the first substrate 1 and the second substrate 7 within a plane perpendicular to the optical axis of the laser beam Lh.

When only one device 5 will be transferred, single spot irradiation may be carried out onto the release layer 3 in a region corresponding to the selected device 5.

Figure 1C:
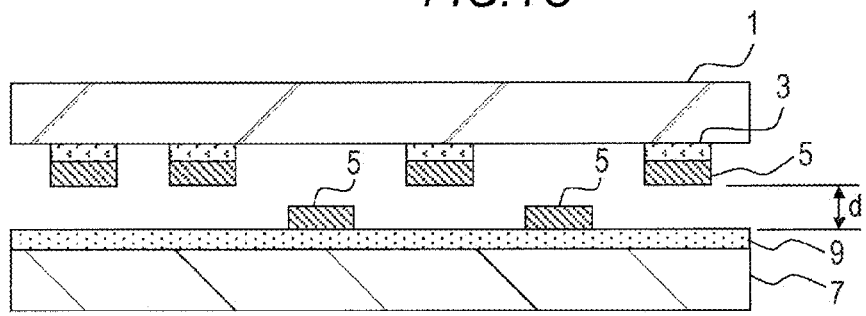

With the above-described laser irradiation, as shown in FIG. 1C, the release layer 3 at the irradiation position of the laser beam Lh is evaporated and removed by ablation. If the release layer 3 is ablated, the device 5 is separated from the first substrate 1, scattered linearly toward the second substrate 7, and adhered and fixed to the adhesive layer 9 of the second substrate 7.

Figure 1D:
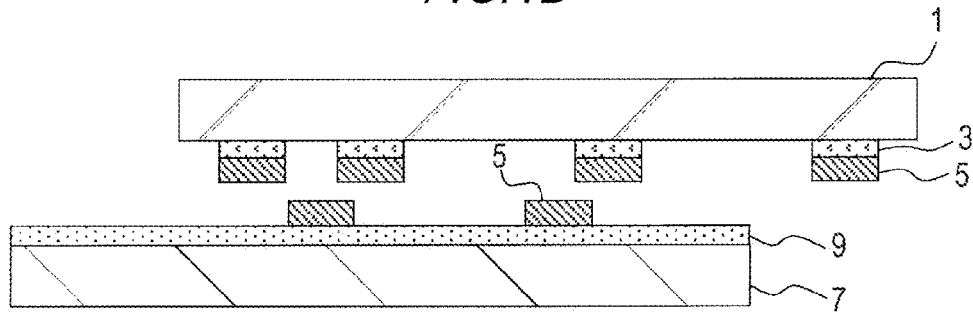

Subsequently, as shown in FIG. 1D, the first substrate 1 is moved (released) with respect to the second substrate 7 onto which the selected device 5 is transferred. Thus, the devices 5 on the release layer 3 which is left while the laser beam Lh is not irradiated are released to the first substrate 1 side along with the release layer 3.

Thereafter, the above-described process is repeated using a new first substrate on which different devices are formed and the second substrate 7 on which the device 5 is already transferred, such that a plurality of kinds of devices may be transferred onto the second substrate 7.

When a plurality of kinds of devices are transferred, the first substrate 1 and the second substrate 7 may be arranged to be spaced from and opposite each other such that the distance d between the devices 5 on the first substrate 1 and the adhesive layer 9 on the second substrate 7 is larger than the thickness of the device 5 which is already transferred on the second substrate 7. Thus, a plurality of kinds of devices can be transferred from the second substrate 7 without affecting the device 5 which is already transferred on the second substrate 7.

The first substrate 1 is relatively moved in a horizontal direction with respect to the second substrate 7 within the surface of the first substrate 1, the process described with reference to FIGS. 1A to 1D may be repeated at the moved position.

According to the above-described method of transferring a device of the first embodiment, as described with reference to FIG. 1B, when the laser beam Lh is irradiated from the first substrate 1 side arranged to be spaced from the second substrate 7, the laser beam Lh is irradiated onto the entire surface of the release layer 3 equal to or smaller than the device 5. Thus, the scattering direction of the device 5 by ablation of the release layer 3 is controlled vertically with respect to the surfaces of the first substrate 1 and the second substrate 7.

As a result, the scattering direction of the device 5 is satisfactorily controlled without processing the surface of the device 5, such that the device 5 can be accurately transferred from the first substrate 1 onto the second substrate 7.

FIGS. 2A to 2F are microscope photographs of the first substrate 1 and the second substrate 7 when the device is transferred while the axisymmetry of the device 5 and the laser beam Lh is gradually shifted. Referring to FIG. 2A to FIG. 2F, the axisymmetry gradually increases in that order. In the drawings, A represents the first substrate side, and a broken-line portion represents an arrangement portion of a device to be transferred. In the drawings, B represents the second substrate side, and a boxed portion represents a device transfer region.

Figure 2A:
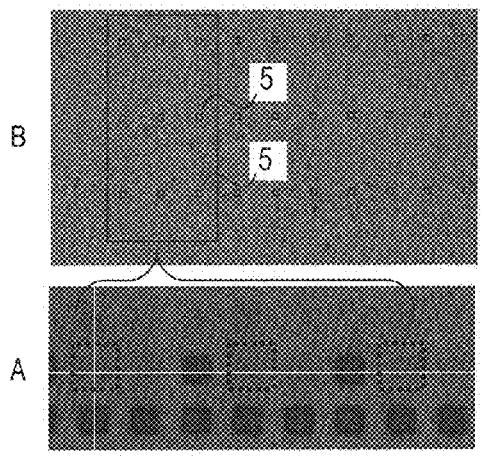
FIGS. 2A to 2F are diagrams showing a transfer result per irradiation energy of a laser beam.
Figure 2B:
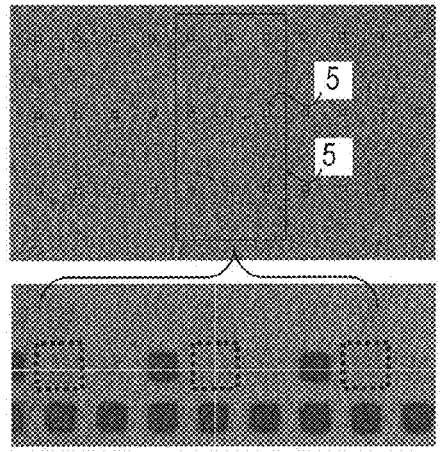
Figure 2C:
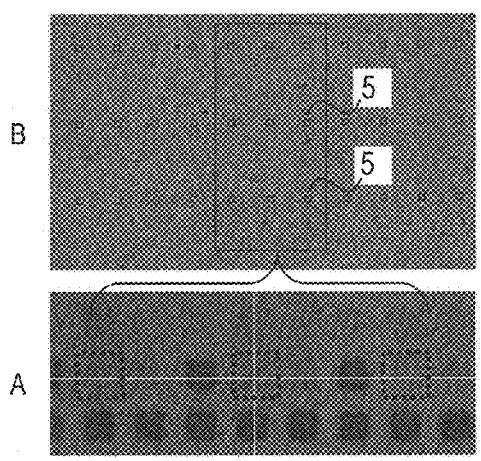
Figure 2D:
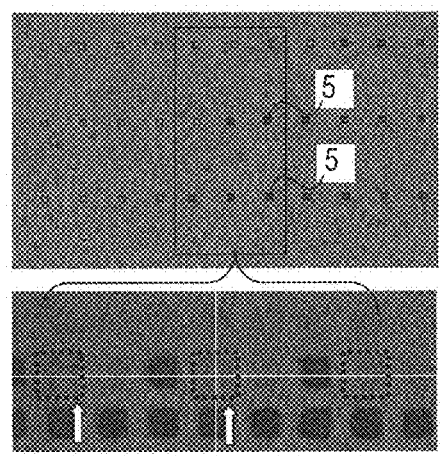
Figure 2E:
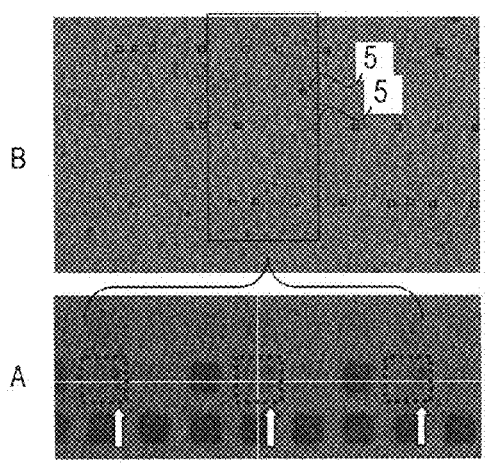
Figure 2F:
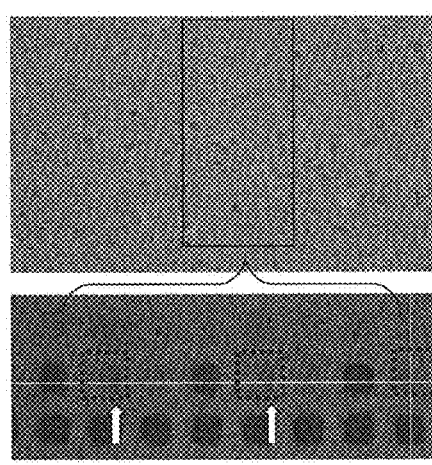

As shown in the drawings, it can be seen that, in FIGS. 2A to 2C in which the axisymmetry is slightly shifted, the release layer on the first substrate side is not left, and the devices 5 are regularly transferred onto the second substrate. Meanwhile, in FIGS. 2D to 2F in which the axisymmetry is significantly shifted, as irradiation energy is small, the release layer is left without being ablated to the second substrate (portion indicated by white arrow). In B in FIG. 2D, it is found that some of the transferred devices are transferred onto the second substrate in a state where the transfer position is rotated. From B in FIG. 2E, it is found that most of the transferred devices are transferred onto the second substrate in a state where the transfer position is not determined or is rotated. In addition, from B in FIG. 2F, it is found that all the transferred devices are transferred onto the second substrate in a state where the transfer position is not determined or is rotated.

As described above, it can be seen that, when the laser beam Lh is irradiated, the axisymmetry of the device 5 and the laser beam Lh is maintained significantly, such that ablation can be prevented from being left, and the scattering direction of the device 5 can be reliably controlled vertically with respect to the surfaces of the first substrate 1 and the second substrate 7. In addition, the transferred devices can be prevented from being rotated within the substrate surface.

The transfer method is carried out in a state where the first substrate 1 and the second substrate 7 are arranged to be spaced from and opposite each other, so advantageous effects described in 1) to 6) can be obtained.

1) The number of devices 5 to be transferred onto the second substrate 7 or the device size and the transfer position onto the second substrate 7 can be arbitrarily set regardless of the difference in size or shape between the first substrate 1 with the devices arranged thereon and the second substrate 7, and the range in which a device can be transferred is not limited.

2) There is no relative positional shift due to contact of the first substrate 1 and the second substrate 7. For this reason, accuracy of the transfer position can be prevented from being deteriorated and high repetitive reproducibility can be ensured.

3) Foreign particles can be prevented from being generated or stuck due to contact of the first substrate 1 and the second substrate 7.

4) It is not necessary to bring the first substrate 1 and the second substrate 7 into close contact with each other or to separate the first substrate 1 and the second substrate 7 which are brought into close contact with each other, so a takt time is shortened.

5) A new device 5 can be transferred onto the first substrate 1, onto which the devices 5 are already transferred, from the new second substrate 7, regardless of the devices 5 which are already transferred onto the first substrate 1. For this reason, as described in a subsequent second embodiment, when some of devices has failed to be transferred, a repair can be easily performed.

6) The first substrate 1 and the second substrate 7 are not in contact with each other, so the device 5 can be transferred with no unnecessary interference between the device 5 to be transferred and the first and second substrates 1 and 7. Thus, the irradiation energy of the laser beam Lh necessary for transferring the devices 5 is suppressed to such an extent that the release layer 3 is removed. Therefore, it can be expected the effects that the number of devices 5 to be transferred per pulse of the laser beam Lh can be increased, and the transfer speed of the devices 5 can be increased. As a result, apparatus cost and running cost can be significantly reduced. In addition, the energy density of the laser beam Lh can be decreased, and contamination (dissolved release layer) can be significantly reduced. When the device 5 to be transferred is, for example, a semiconductor device, such as an LED or an LD, the contamination may cause leakage fault or the like in the current-voltage characteristics. For this reason, the laser irradiation density is decreased by this method, such that leakage fault can be reduced.

Second Embodiment

A repair method of transferring a device with respect to a device absent part of a second substrate from a first substrate will be described as a second embodiment with reference to FIGS. 3A to 4D.

Figure 3A:
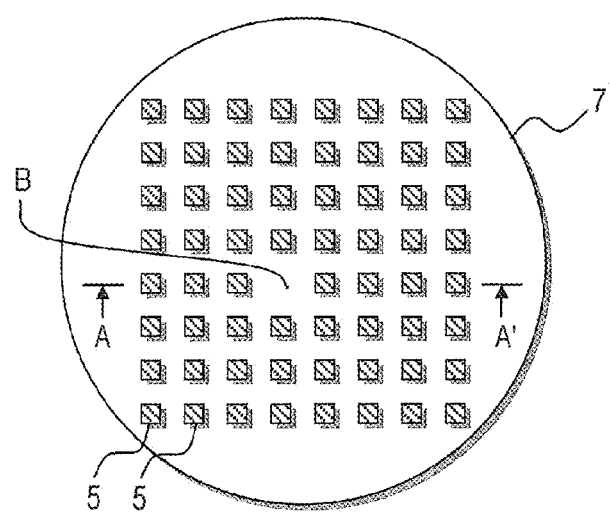
FIGS. 3A and 3B are configuration diagrams of a second substrate having a device absent part for explaining a second embodiment.
Figure 3B:
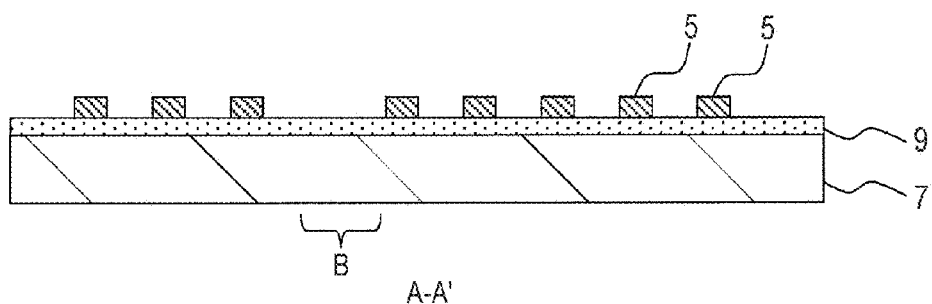

As shown in a plan view of FIG. 3A and a sectional view of FIG. 3B [corresponding to a section taken along the line A-A' of FIG. 3A], devices 5 are transferred onto a second substrate 7 in a predetermined arrangement by the procedure of the first embodiment or other procedures. In this state, a device absent part B where a device 5 has failed to be transferred exists on the second substrate 7, and the device 5 is transferred with respect to a device absent part B such that a repair is carried out.

Figure 4A:
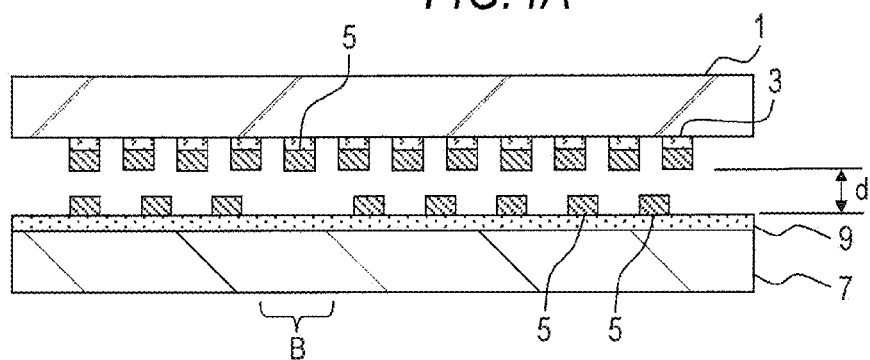
FIGS. 4A to 4D are sectional process views showing a method of repairing a device absent part according to the second embodiment.

In this case, first, as shown in FIG. 4A, a new first substrate 1 on which devices 5 for a repair are mounted is arranged to be opposite a second substrate 7 on which a plurality of devices 5 are already transferred. In this case, similarly to the first embodiment, the first substrate 1 and the second substrate 7 are arranged to be spaced from each other in a state where the devices 5 and the adhesive layer 9 face each other. The cycle of the arrangement pitch of the devices 5 on the first substrate 1 may be irregularly shifted regardless of the cycle of the transfer pitch of the devices 5 on the second substrate 7.

In particular, it is important that the first substrate 1 and the second substrate 7 are arranged such that the device 5 on the first substrate 1 faces the device absent part B of the second substrate 7.

The first substrate 1 and the second substrate 7 are arranged to be spaced from and opposite each other such that the distance d between the devices 5 on the first substrate 1 and the adhesive layer 9 on the second substrate 7 is larger than the thickness of the devices 5 which are already transferred onto the second substrate 7. The devices 5 on the first substrate 1 and the devices 5 which are already transferred onto the second substrate 7 are of the same type. For this reason, as described in the first embodiment, the first substrate 1 and the second substrate 7 may be arranged to be spaced from and opposite each other in parallel such an extent that the distance d between the devices 5 on the first substrate 1 and the adhesive layer 9 on the second substrate 7 is larger than the thickness of the devices 5.

Figure 4B:
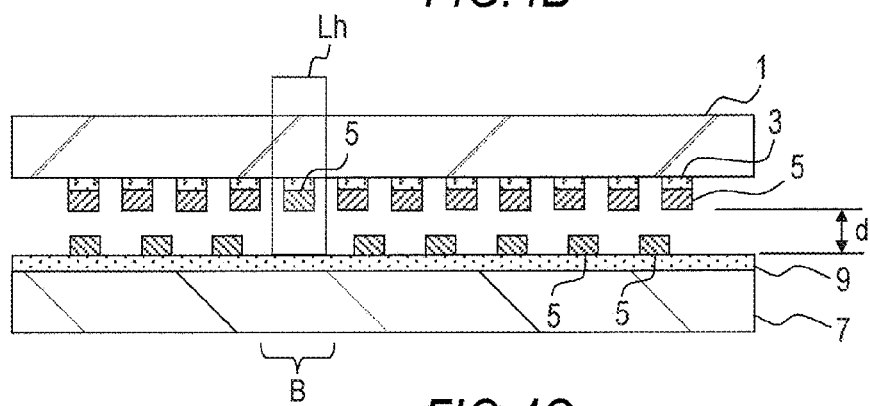

In the above-described state, as shown in FIG. 4B, the laser beam Lh is selectively irradiated only onto a position corresponding to the device absent part B from the first substrate 1 side. At this time, the laser beam Lh to be irradiated is the same as that in the first embodiment, and has a wavelength such that only the release layer 3 absorbs the laser beam Lh. The laser beam Lh is irradiated onto the entire surface of the release layer 3 between the selected device 5 and the first substrate 1. In addition, similarly to the first embodiment, the laser beam Lh is preferably irradiated with energy such that the release layer 3 between the selected device 5 and the first substrate 1 is completely evaporated and removed by ablation.

Figure 4C:
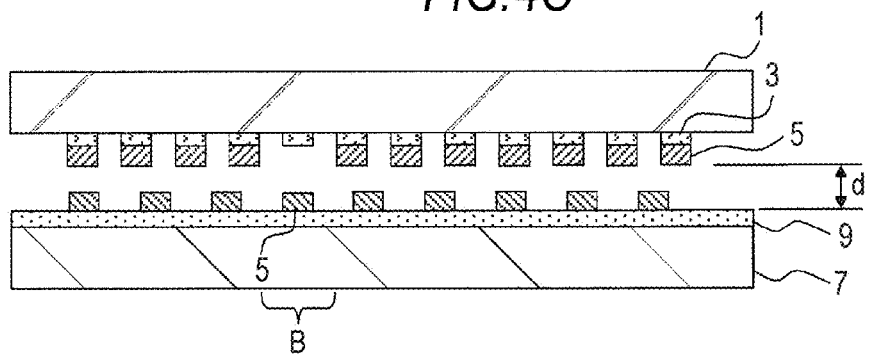
Figure 4D:
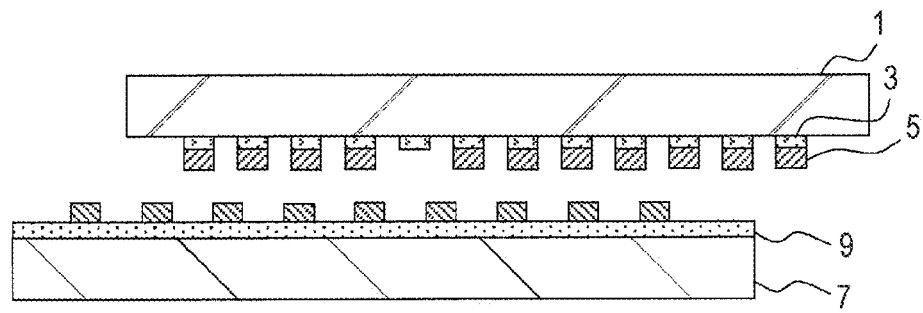

With the above-described laser irradiation, as shown in FIG. 4C, the release layer 3 at the irradiation position of the laser beam Lh is ablated, and the device 5 is adhered and fixed to the adhesive layer 9 of the second substrate 7, such that the device 5 is transferred onto the second substrate 7.

Thereafter, as shown in FIG. 1D, the first substrate 1 is moved (released) with respect to the second substrate 7 onto which the selected device 5 is transferred. Thus, the repair is completed.

When a plurality of device absent parts B exist on the second substrate 7, the laser beam Lh may be irradiated multiple times while the irradiation position is changed. In addition, the laser beam Lh may be irradiated onto a plurality of device absent parts B in a lump by using a light-blocking mask. Meanwhile, when the cycle of the arrangement pitch of the devices 5 on the first substrate 1 is shifted from the cycle of the transfer pitch of the devices 5 on the second substrate 7, the first substrate 1 and the second substrate 7 should be relatively moved and positioned such that the device 5 left on the first substrate 1 is arranged to be opposite the device absent part B to be next repaired of the second substrate 7. At this time, the relative movement of the substrates 1 and 7 may be made only in the horizontal direction.

According to the second embodiment, when the laser beam Lh is irradiated from the first substrate 1 side which is arranged to be spaced from and opposite the second substrate 7, the laser beam Lh is irradiated onto the entire surface of the release layer 3 on which an intended device 5 is provided. Thus, the scattering direction of the device 5 can be controlled vertically with respect to the surfaces of the first substrate 1 and the second substrate 7. Therefore, a repair can be carried out such that the device 5 is accurately transferred with respect to the device absent part B.

In addition, the first substrate 1 and the second substrate 7 are arranged to be spaced from and opposite each other, so a new device 5 can be easily transferred onto the first substrate 1, onto which the devices 5 are already transferred, from a new second substrate 7, regardless of the devices 5 which are already transferred onto the first substrate 1.

Third Embodiment

A first example where arrangement on a first substrate is changed and devices are rearranged on a second substrate will be described as a third embodiment with reference to FIGS. 5 and 6. In this case, description will be provided for the transfer when the characteristics of device columns are averaged.

Figure 5:
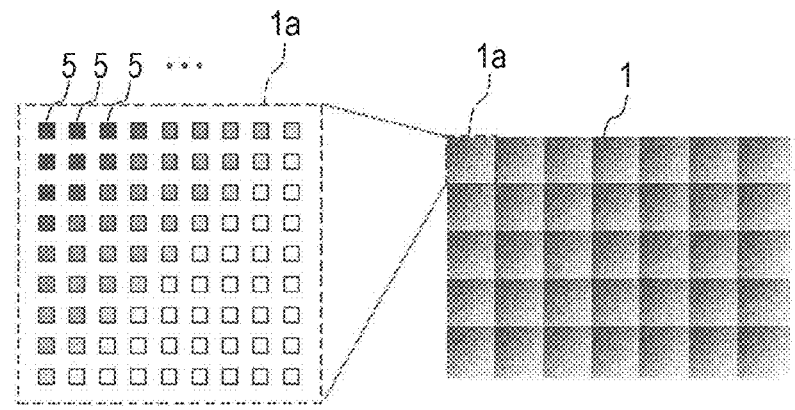
FIG. 5 is a view showing a state where a plurality of light-emitting devices are mounted on a first substrate with a light-emission intensity distribution.

FIG. 5 shows a state where a plurality of light-emitting devices 5 are mounted on the first substrate 1 with a light-emission intensity distribution. Such a light-emission intensity distribution results from a distribution on a wafer on which light-emitting devices 5 are formed.

Figure 6A:
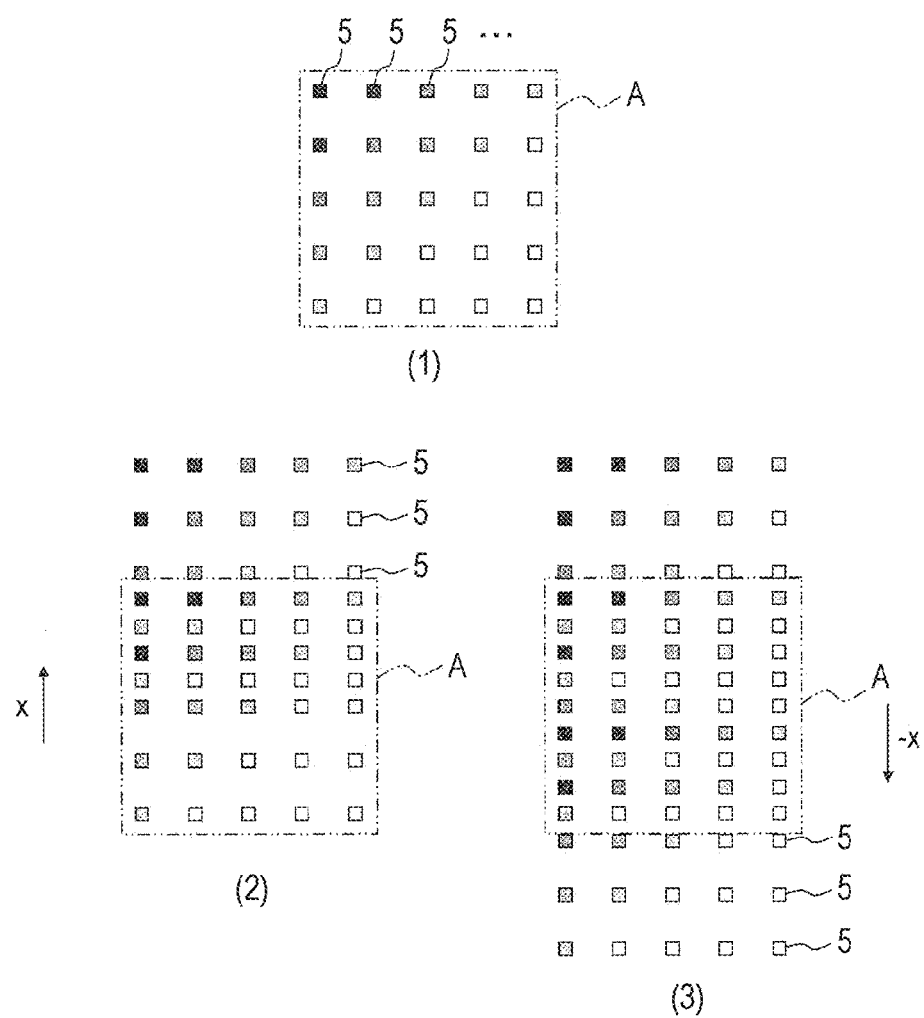
FIG. 6A is a diagram (first diagram) illustrating a transfer method according to a third embodiment.
Figure 6B:
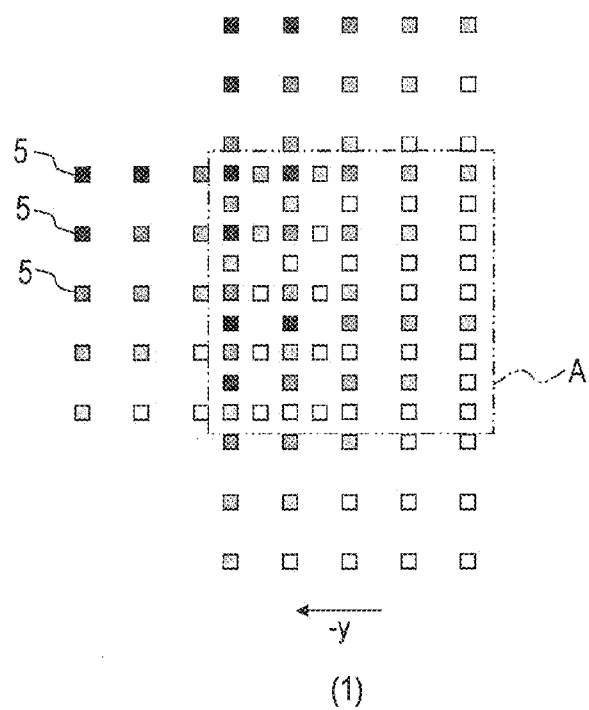
FIG. 6B is a diagram (second diagram) illustrating the transfer method according to the third embodiment.
Figure 6B:
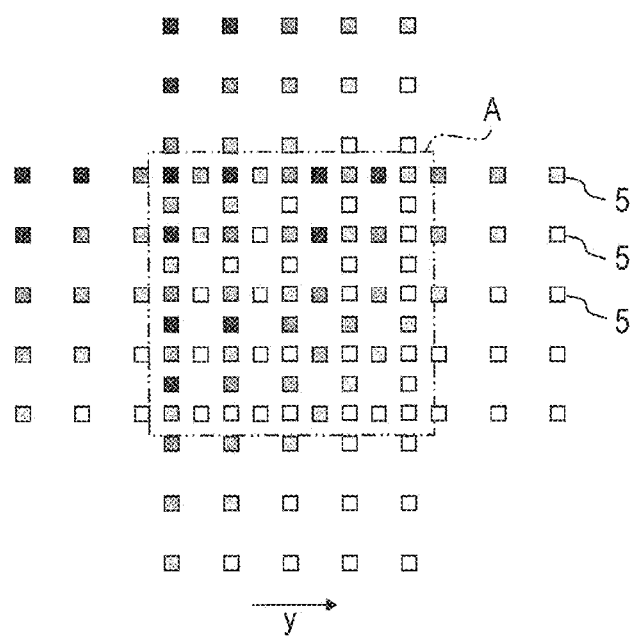
Figure 6C:
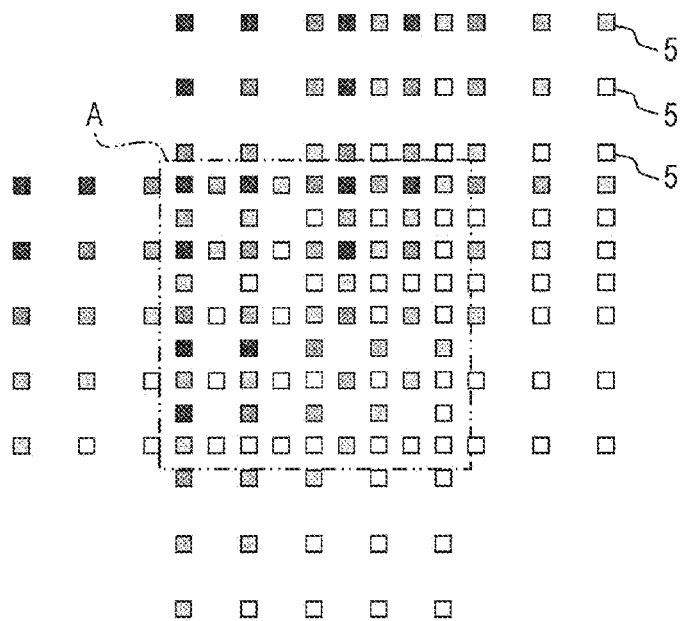
FIG. 6C is a diagram (third diagram) illustrating the transfer method according to the third embodiment.
Figure 6C:
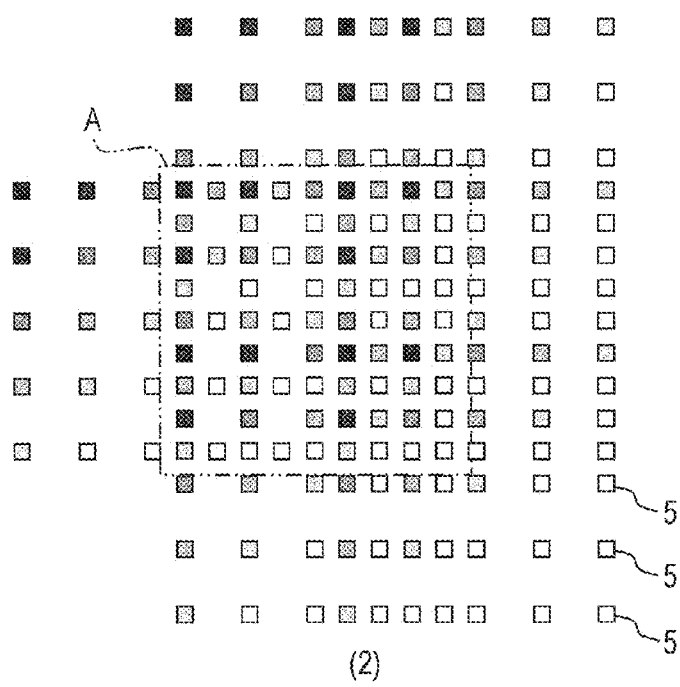

In this case, first, as shown in FIG. 6A(1), the devices 5 which are alternately arranged are transferred from the first substrate 1 to a first transfer range A on the second substrate. Next, as shown in FIG. 6A(2), second transfer is carried out in a nested shape from the first substrate to the second substrate at a position where the transfer range is moved in the horizontal direction so as to be shifted by half in an +x direction with respect to the transfer range A. In addition, as shown in FIG. 6A(3), third transfer is carried out in a nested shape from the first substrate to the second substrate at a position where the transfer range is moved in the horizontal direction so as to be shifted by half in an −x direction with respect to the transfer range A. Next, as shown in FIG. 6B(1), fourth transfer is carried out in a nested shape from the first substrate to the second substrate at a position where the transfer range is moved in the horizontal direction so as to be shifted by half in a −y direction with respect to the transfer range A. Subsequently, as shown in FIGS. 6B(2) to 6D(2), transfer is carried out in a nested shape nine times at respective positions where the transfer range is moved in the horizontal direction so as to be shifted in the respective directions.

Figure 6D:
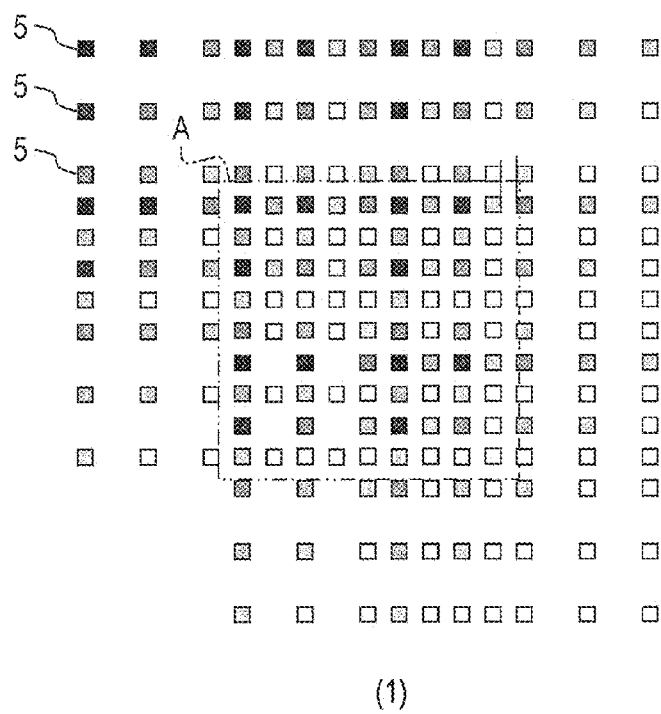
FIG. 6D is a diagram (fourth diagram) illustrating the transfer method according to the third embodiment.
Figure 6D:
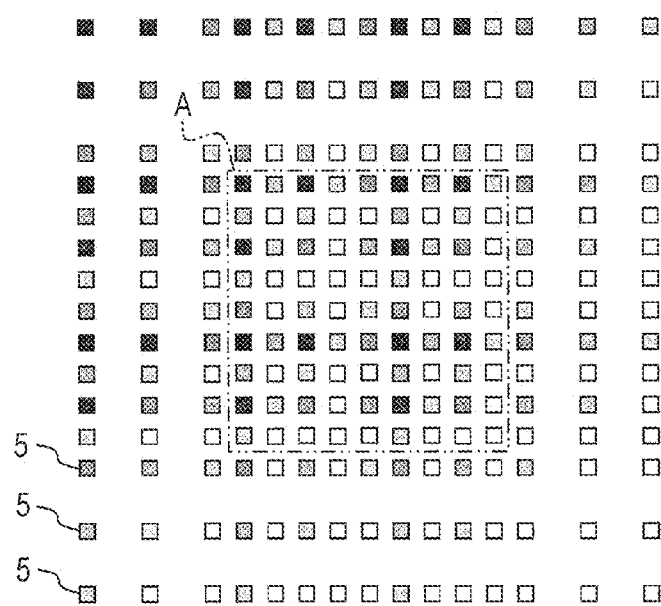

Thus, as shown in FIG. 6D(2), the devices 5 can be rearranged within the transfer range A such that the light-emission intensity distribution of the light-emitting devices 5 is averaged.

Fourth Embodiment

A second example where arrangement on a first substrate is changed and devices on a second substrate are arranged will be described as a fourth embodiment with reference to FIGS. 5 and 7. Here, as the transfer when the characteristics of the device columns are averaged, similarly to that shown in FIG. 5, a transfer method which, when a plurality of light-emitting devices 5 are mounted on the first substrate 1 with a light-emission intensity distribution, averages the light-emission intensity distribution will be described.

Figure 7A:
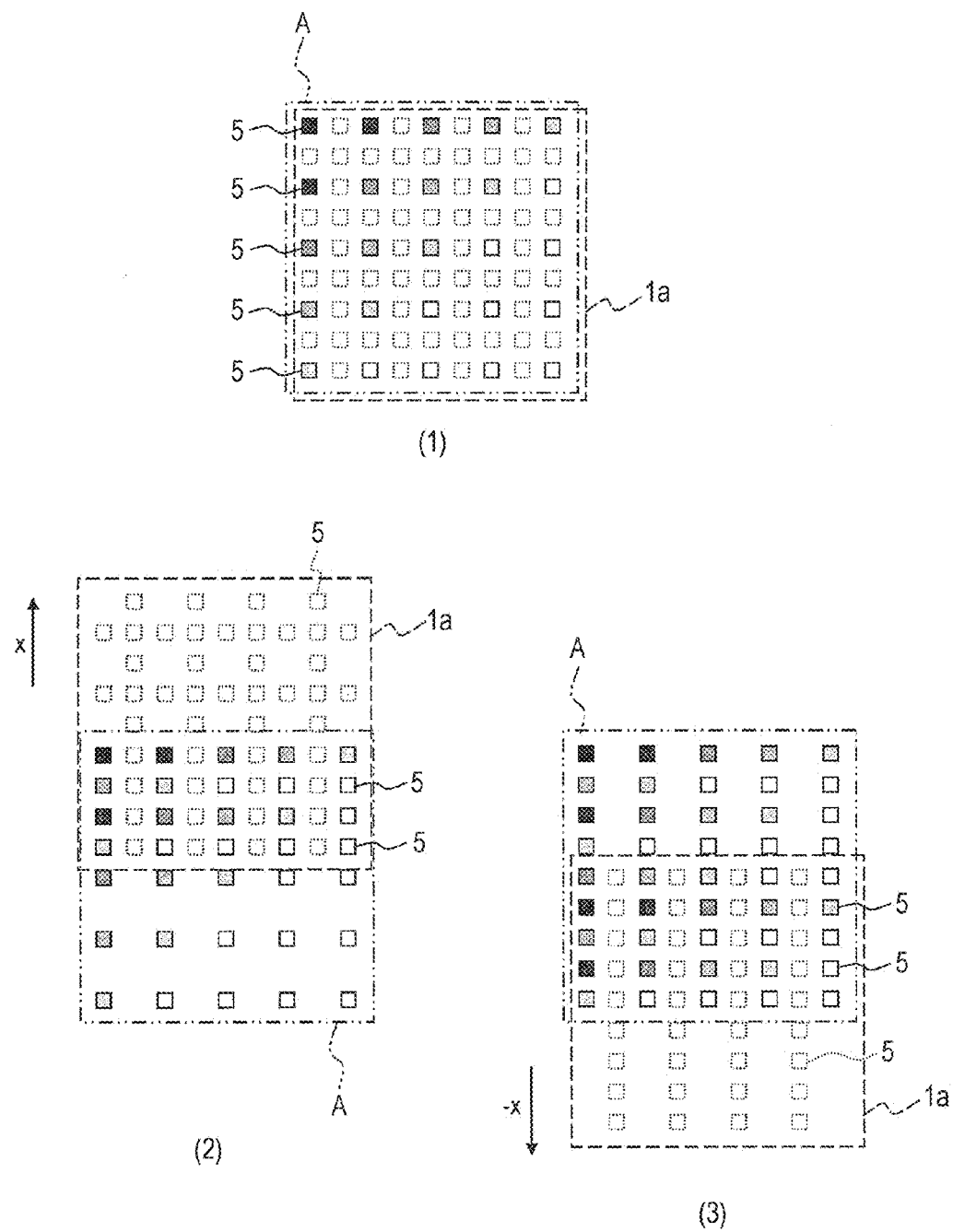
FIG. 7A is a diagram (first diagram) illustrating a transfer method according to a fourth embodiment.
Figure 7B:
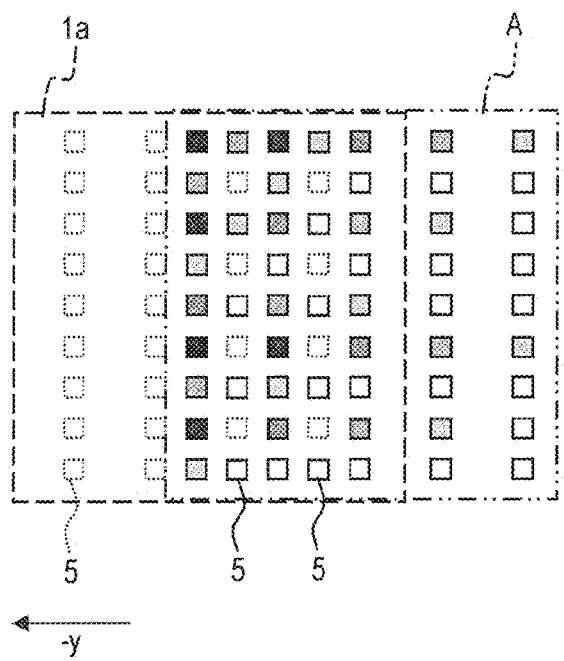
FIG. 7B is a diagram (second diagram) illustrating the transfer method according to the fourth embodiment.
Figure 7B:
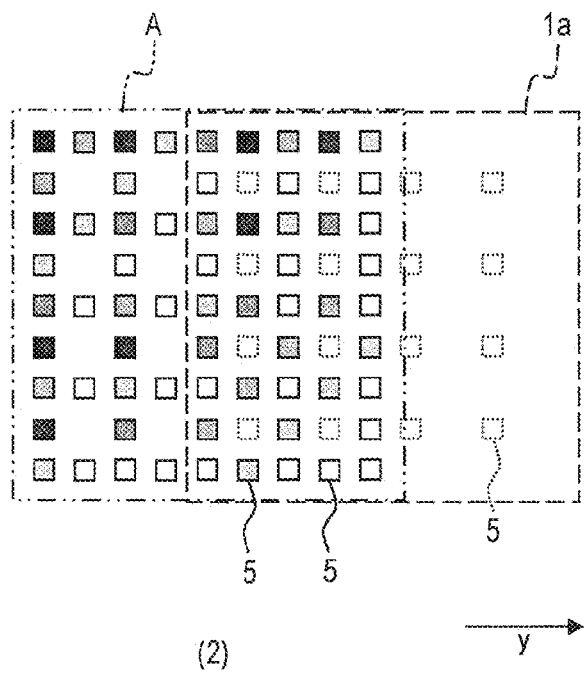

In this case, first, as shown in FIG. 7A(1), the devices 5 which are alternately arranged are transferred from a region 1a on the first substrate 1 to a transfer range A on the second substrate. Next, as shown in FIG. 7A(2), second transfer is carried out in a nested shape from the region 1a on the first substrate 1, which is moved in the horizontal direction such that the transfer range is shifted by half in an +x direction with respect to the transfer range A, only to the transfer range A of the second substrate. In addition, as shown in FIG. 7A(3), third transfer is carried out in a nested shape from the region 1a on the first substrate, which is moved in the horizontal direction such that the transfer range is shifted by half in an −x direction with respect to the transfer range A, only to the transfer range A of the second substrate. Next, as shown in FIG. 7B(1), fourth transfer is carried out in a nested shape from the region 1a of the first substrate, which is moved in the horizontal direction such that the transfer range is shifted by half in a −y direction with respect to the transfer range A, only to the transfer range A of the second substrate. Thereafter, as shown in FIGS. 7B(2) to FIG. 7C(4), transfer is carried out in a nested shape nine times at respective positions where the transfer range is moved in the horizontal direction so as to be shifted in the respective directions.

Figure 7C:
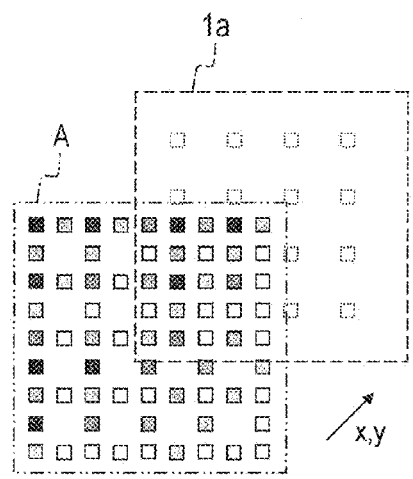
FIG. 7C is a diagram (third diagram) illustrating the transfer method according to the fourth embodiment.
Figure 7C:
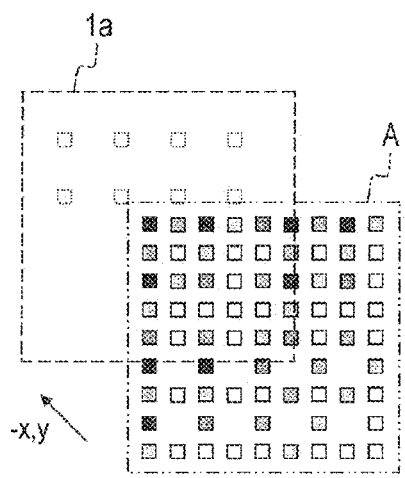
Figure 7C:
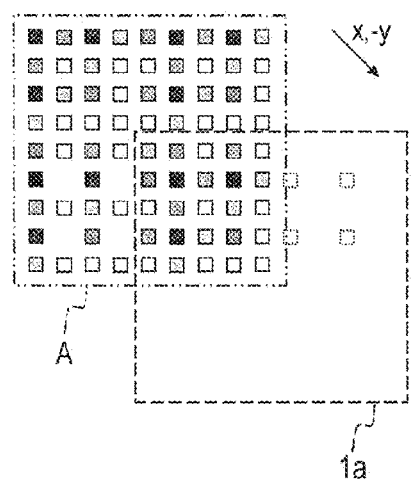
Figure 7C:
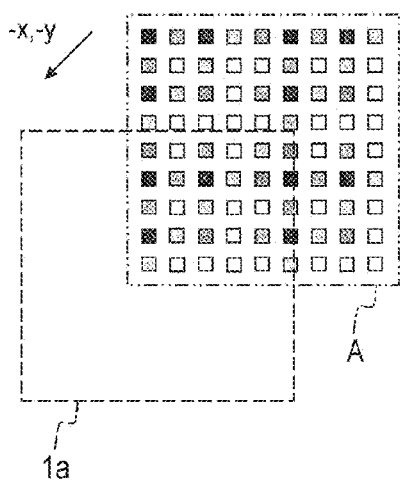

Thus, as shown in FIG. 7C(4), the devices 5 can be rearranged within the transfer range A such that the light-emission intensity distribution of the light-emitting devices 5 is averaged.

In the above-described third and fourth embodiments, as the example where the devices on the first substrate 1 are transferred to be rearranged on the second substrate 7, a method has been described in which the devices are arranged in a nested shape. In addition to the nested shape, various averaging methods using an arbitrary property of chip arrangement, such as extension arrangement or comb-shaped arrangement, may be used.

The present application contains subject matter related to that disclosed in Japanese Priority Patent Application JP 2009-095896 filed in the Japan Patent Office on Apr. 10, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of transferring a device from a first substrate to a second substrate, the method comprising the steps of:
   providing the first substrate with the device and a release layer having a planar shape equal to or smaller than the device;
   providing the second substrate with an adhesive layer thereon;
   arranging the first and second substrates so as to face each other;
   interposing the device between the first and second substrate such that the device and the adhesive layer face each other; and
   irradiating the entire surface of the release layer with a laser beam having an irradiation area larger than a base area of the release layer so as to ablate the release layer thereby separating the device from the first substrate while transferring the device to the second substrate.

2. The method according to claim 1, wherein the laser beam is irradiated axisymmetically with respect to the device.

3. The method according to claim 1 or 2, wherein the release layer has a planar shape similar to the device.

4. The method according to claim 1, wherein a plurality of devices are provided on the first substrate and the laser beam is irradiated only onto the release layer corresponding to a first device selected from the plurality of devices provided on the first substrate.

5. The method according to claim 1, wherein the first substrate and the second substrate are arranged such that a distance between the device on the first substrate and the adhesive layer on the second substrate is larger than the thickness of the device.

6. The method according to claim 4, wherein, after the first device is transferred from the first substrate onto the second substrate, the second substrate is moved in a horizontal direction with respect to the first substrate, and
   the laser beam is irradiated onto the release layer corresponding to a second device selected from the remaining devices on the first substrate so as to separate the second device from the first substrate and to transfer the second device onto the second substrate.

7. The method according to claim 4, wherein the first substrate and the second substrate are arranged such that a distance between a second device on the first substrate and the adhesive layer on the second substrate is larger than the thickness of the first device.

* * * * *

UNITED STATES PATENT AND TRADEMARK OFFICE
CERTIFICATE OF CORRECTION

PATENT NO. : 8,361,268 B2
APPLICATION NO. : 12/731799
DATED : January 29, 2013
INVENTOR(S) : Takeshi Mizuno, Katsuhiro Tomoda and Toyoharu Oohata Page 1 of 1

It is certified that error appears in the above-identified patent and that said Letters Patent is hereby corrected as shown below:

On the Title Page

The Foreign Application Priority Data is missing.

Please add:

Item (30) Foreign Application Priority Data

--Apr. 10, 2009 (JP) P2009-095896--

Signed and Sealed this
Twenty-eighth Day of May, 2013

Teresa Stanek Rea
*Acting Director of the United States Patent and Trademark Office*